(12) United States Patent
Ha et al.

(10) Patent No.: US 8,012,527 B2
(45) Date of Patent: Sep. 6, 2011

(54) MANUFACTURING METHOD OF DISPLAY DEVICE AND DISPLAY DEVICE THEREFROM

(75) Inventors: Jae kook Ha, Yongin-si (KR); Yong Suk Jin, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 1338 days.

(21) Appl. No.: 11/557,152

(22) Filed: Nov. 7, 2006

(65) Prior Publication Data

US 2007/0120469 A1 May 31, 2007

(30) Foreign Application Priority Data

Nov. 28, 2005 (KR) .................. 10-2005-0114373

(51) Int. Cl.
*B05D 5/06* (2006.01)
*B05D 1/36* (2006.01)
(52) U.S. Cl. ........ 427/66; 427/256; 427/265; 427/427.4
(58) Field of Classification Search ............... 427/66, 427/256, 265, 427.4
See application file for complete search history.

(56) References Cited

U.S. PATENT DOCUMENTS

| 6,830,494 | B1 * | 12/2004 | Yamazaki et al. | 445/24 |
| 2001/0001050 | A1 * | 5/2001 | Miyashita et al. | 428/690 |
| 2005/0067949 | A1 * | 3/2005 | Natarajan et al. | 313/504 |
| 2005/0089720 | A1 * | 4/2005 | Imanishi | 428/690 |

FOREIGN PATENT DOCUMENTS

| JP | 2001-291583 | * | 10/2001 |
| JP | 2003-142261 | * | 5/2003 |
| JP | 2004-071506 | * | 3/2004 |

* cited by examiner

*Primary Examiner* — James Lin
(74) *Attorney, Agent, or Firm* — Cantor Colburn LLP

(57) ABSTRACT

A method of manufacturing a display device includes forming a thin film transistor on an insulating substrate, forming an electrode electrically connected to the thin film transistor, forming a wall surrounding the electrode, ejecting ink comprising an organic material and a first solvent on the electrode, and supplying a second solvent to the ink. Thus, an organic layer of uniform quality is formed in the display device formed by the method.

20 Claims, 18 Drawing Sheets

SUPERSONIC WAVE

MANUFACTURING METHOD OF DISPLAY DEVICE AND DISPLAY DEVICE THEREFROM

This application claims priority to Korean Patent Application No. 2005-0114373, filed on Nov. 28, 2005 and all the benefits accruing therefrom under 35 U.S.C. §119, and the contents of which in its entirety are herein incorporated by reference.

BACKGROUND OF THE INVENTION

1. Field of the Invention

The present invention relates to a manufacturing method of a display device and a display device therefrom. More particularly, the present invention relates to a manufacturing method of a display device having an improved organic layer, and a display device therefrom.

2. Description of the Related Art

Recently, an organic light emitting diode ("OLED") has become popular since it is driven through a low voltage, is light and small, has a wide viewing angle, and responds with high speed. The OLED is classified into a passive matrix type and an active matrix type according to a driving method. The passive matrix type has a simple production process, but drastically increases power consumption with an increase in size and resolution. Thus, the passive matrix type is mainly employed in small display devices. Meanwhile, the active matrix type realizes a wide screen and high resolution, but has a more complicated production process.

In the active matrix type OLED, a thin film transistor ("TFT") is connected in every pixel region to control an organic light emitting layer. A pixel electrode is provided in each of the pixel regions, and the pixel electrodes are electrically separated from each other to be driven independently. An organic layer such as a hole injecting layer and the organic light emitting layer controlled by a TFT is formed on the pixel electrodes.

Typically, the organic layer is formed through an inkjet method, in which ink including an organic material is ejected on the pixel electrode surrounded by a wall, and then is dried. However, the quality of the organic layer is not uniform due to the varying drying conditions of ink according to ejected orders.

BRIEF SUMMARY OF THE INVENTION

Accordingly, the present invention provides a manufacturing method of a display device having an organic layer of uniform quality.

Also, the present invention provides a display device having an organic layer of uniform quality.

The foregoing and/or other aspects of the present invention can be achieved by providing a method of manufacturing a display device, the method including forming a thin film transistor ("TFT") on an insulating substrate, forming an electrode electrically connected to the TFT; forming a wall surrounding the electrode, ejecting ink including an organic material and a first solvent on the electrode surrounded by the wall, and supplying a second solvent to the ink ejected on the electrode.

According to another aspect of the present invention, the TFT and the electrode are plurally provided, and the second solvent is supplied after ejecting the ink on all electrodes.

According to another aspect of the present invention, the ink is sequentially ejected, and the second solvent is more supplied to earlier-ejected ink.

According to another aspect of the present invention, a combined amount of the first solvent and the second solvent is substantially uniform across the plurally provided electrode.

According to another aspect of the present invention, the method further includes applying a supersonic wave to the ink which has received the second solvent.

According to another aspect of the present invention, the first and second solvents include a same material.

According to another aspect of the present invention, the first solvent includes a first sub solvent having a first boiling point and a second sub solvent having a second boiling point that is higher than the first boiling point, and the second solvent and the second sub solvent comprise a same material.

According to another aspect of the present invention, the first solvent has a lower boiling point than the second solvent.

According to another aspect of the present invention, the organic material is redissolved by the first solvent and the second solvent after supplying the second solvent.

According to another aspect of the present invention, the method further includes forming an organic layer by drying and removing the first solvent and the second solvent while the organic material is redissolved.

According to another aspect of the present invention, the organic layer includes an organic light emitting layer.

According to another aspect of the present invention, the ink and the second solvent are ejected through an inkjet method, and the second solvent is ejected less accurately than the ink.

According to another aspect of the present invention, the ink is a hole injecting ink, and the method further includes forming a hole injecting layer with the hole injecting ink and the second solvent.

According to another aspect of the present invention, the method further includes ejecting a colored light emitting ink on the hole injecting layer, the colored light emitting ink including a light emitting material and a third solvent, and supplying a fourth solvent to the colored light emitting ink ejected on the hole injecting layer.

According to another aspect of the present invention, the method further includes forming an organic light emitting layer with the colored light emitting ink and the fourth solvent.

According to another aspect of the present invention, the thin film transistor and the electrode are plurally provided, and ejecting ink includes alternately ejecting red, green, and blue light emitting inks, and further forming an organic light emitting layer of uniform thickness from the red, green, and blue light emitting inks and the second solvent. The second solvent may be different for each of the red, green, and blue light emitting inks.

The foregoing and/or other aspects of the present invention can also be achieved by providing a display device including an insulating substrate, a TFT formed on the insulating substrate, an electrode electrically connected with the TFT, a wall surrounding the electrode, and an organic layer formed on the electrode surrounded by the wall, the organic layer formed from an ink including an organic material and a first solvent ejected on the electrode and then supplied with a second solvent.

According to another aspect of the present invention, the TFT and the electrode are plurally provided, and the second solvent is supplied to the electrode after ejecting the ink on all electrodes.

According to another aspect of the present invention, the ink is sequentially ejected, and a greater amount of the second solvent is supplied to earlier-ejected ink than to later-ejected ink.

According to another aspect of the present invention, a combined amount of the first solvent and the second solvent is substantially uniform across the electrode.

According to another aspect of the present invention, a supersonic wave is applied to the ink having the second solvent.

The foregoing and/or other aspects of the present invention can also be achieved by providing a method of manufacturing a display device, the method including forming a plurality of areas on an insulating substrate of the display device, sequentially ejecting ink including an organic material and a first solvent within each area, and supplying a second solvent to the ink to form an organic layer having substantially uniform quality across the display device.

According to another aspect of the present invention, forming a plurality of areas includes forming a black matrix on an insulating substrate of a color filter substrate, and sequentially ejecting ink includes alternately ejecting red, green, and blue color filter inks within the areas.

According to another aspect of the present invention, forming a plurality of areas includes forming walled areas of an organic light emitting diode display and the ink is a hole injecting ink, and the method further includes forming a hole injecting layer from the hole injecting ink and the second solvent.

According to another aspect of the present invention, the method further includes alternately ejecting red, green, and blue light emitting inks, each including a third solvent, on the hole injecting layer and supplying a fourth solvent to the red, green, and blue light emitting inks to form an organic light emitting layer.

According to another aspect of the present invention, the display device includes an organic thin film transistor substrate having a plurality of organic thin film transistors, and the organic material of the ink includes an organic semiconductor material, and the method further includes forming a semiconductor layer of each organic thin film transistor from the ink and the second solvent.

BRIEF DESCRIPTION OF THE DRAWINGS

The above and/or other aspects and advantages of the present invention will become apparent and more readily appreciated from the following description of the embodiments, taken in conjunction with the accompany drawings of which:

FIGS. 3A to 3M illustrate an exemplary manufacturing method of the exemplary display device according to the exemplary embodiment of the present invention.

DETAILED DESCRIPTION OF THE INVENTION

Figure 1:
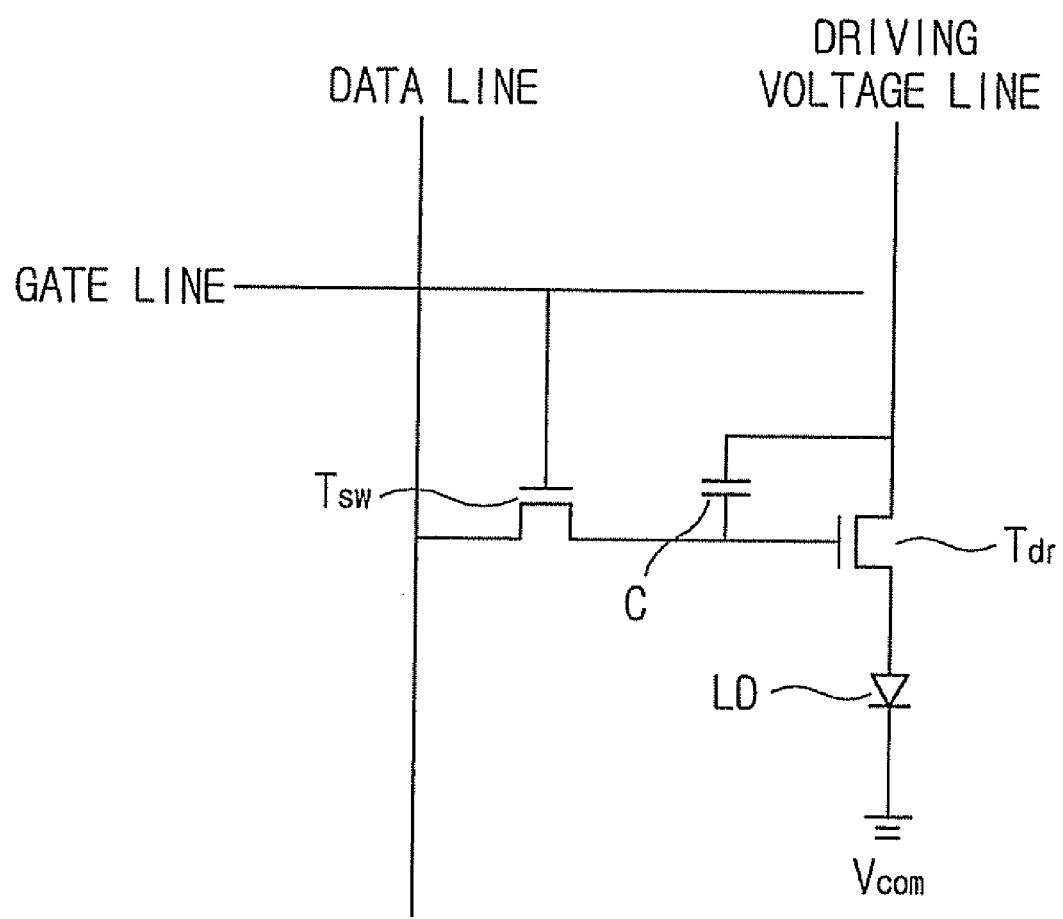
FIG. 1 illustrates an equivalent circuit with respect to an exemplary pixel of an exemplary display device according to an exemplary embodiment of the present invention.

Hereinafter, embodiments of the present invention will be described with reference to accompanying drawings, wherein like numerals refer to like elements and repetitive descriptions will be avoided as necessary. This invention may, however, be embodied in many different forms and should not be construed as limited to the embodiments set forth herein. Rather, these embodiments are provided so that this disclosure will be thorough and complete, and will fully convey the scope of the invention to those skilled in the art.

Hereinafter, a term of "on" means that a new layer (i.e., film) may be interposed or not interposed between two layers (i.e., films), and a term of "directly on" means that two layers (i.e. films) are in contact with each other. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

FIG. 1 illustrates an equivalent circuit with respect to an exemplary pixel of an exemplary display device according to an exemplary embodiment of the present invention.

A single pixel includes a plurality of signal lines. The signal lines for each pixel include a gate line which transmits a scanning signal, a data line which transmits a data signal, and a driving voltage line which transmits a driving voltage. The data line and the driving voltage line are provided in parallel with each other. The gate line is perpendicular to the data line and the driving voltage line.

The respective pixels include an organic light emitting device LD, a switching thin film transistor ("TFT") Tsw, a driving TFT Tdr and a capacitor C.

The driving TFT Tdr includes a control terminal, an input terminal, and an output terminal. The control terminal, such as a gate electrode, is connected with the switching TFT Tsw. The input terminal, such as a source electrode, is connected with the driving voltage line. The output terminal, such as a drain electrode, is connected with the organic light emitting device LD.

The organic light emitting device LD includes an anode which is connected with the output terminal of the driving TFT Tdr, and a cathode which is connected with a common voltage Vcom. The organic light emitting device LD emits lights in different intensity depending on an output current of the driving TFT Tdr, thereby displaying an image. The current of the driving TFT Tdr depends on the voltage between the control terminal and the output terminal of the driving TFT Tdr.

The switching TFT Tsw includes a control terminal, an input terminal, and an output terminal. The control terminal thereof, such as a gate electrode, is connected with the gate line, and the input terminal thereof, such as a source electrode, is connected with the data line. The output terminal, such as a drain electrode, of the switching TFT Tsw is connected with the control terminal of the driving TFT Tdr. The switching TFT Tsw transmits the data signal supplied to the data line according to the scanning signal supplied to the gate line, to the driving TFT Tdr.

The capacitor C is connected between the control terminal and the input terminal of the driving TFT Tdr. The capacitor C charges and maintains the data signal input to the control terminal of the driving TFT Tdr.

Figure 2:
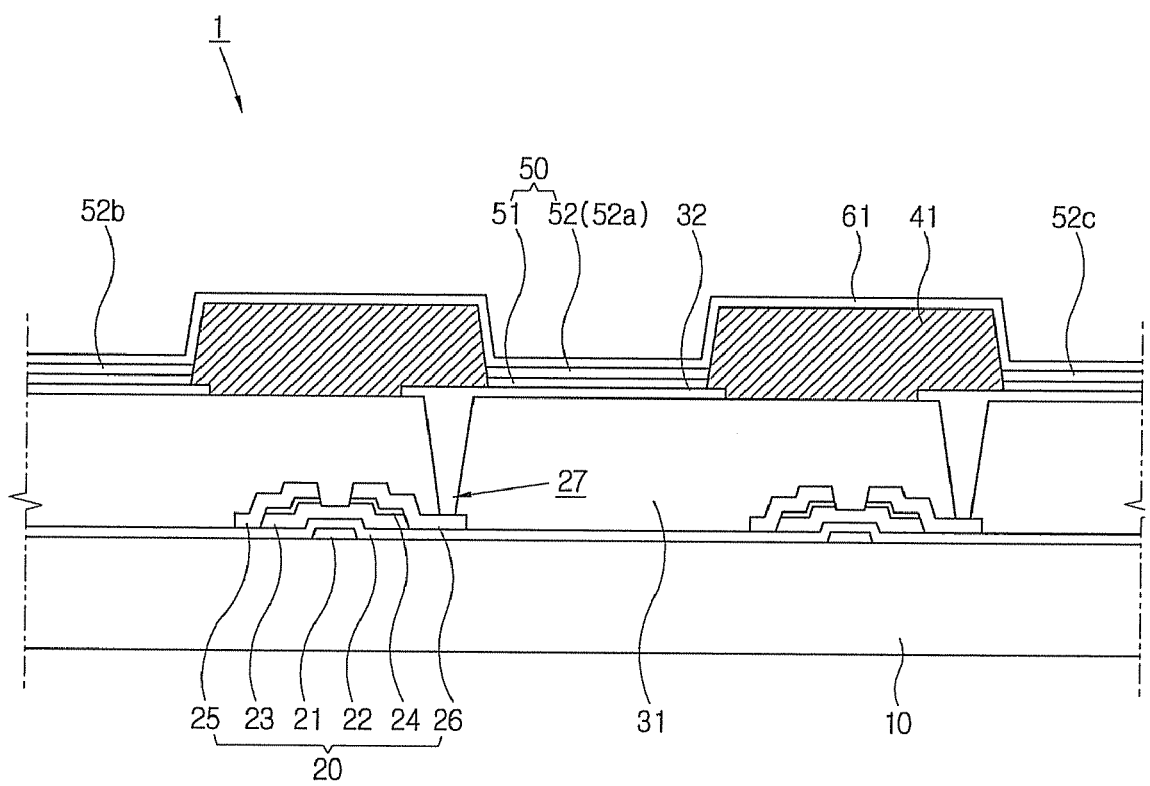
FIG. 2 is a sectional view of the exemplary display device according to the exemplary embodiment of the present invention.

Referring to FIG. 2, the exemplary display device according to the exemplary embodiment of the present invention will be described.

A display device 1 includes a TFT 20 which is formed on an insulating substrate 10, a pixel electrode 32 which is electrically connected with the TFT 20, and an organic layer 50 which is formed on the pixel electrode 32.

The TFT 20 may include, for example, amorphous silicon ("a-Si"), but is not limited thereto. Alternatively, the TFT 20 may include poly silicon.

A gate electrode 21 is formed on the insulating substrate 10 which includes an insulating material such as glass, quartz, ceramic, or plastic.

A gate insulating layer 22 which includes, for example, silicon nitride (SiNx) is formed on the insulating substrate 10 and the gate electrode 21. A semiconductor layer 23 including, for example, a-Si and an ohmic contact layer 24 including, for example, n+ amorphous hydrogenated silicon highly doped with an n-type dopant are sequentially formed on the gate insulating layer 22 corresponding to the gate electrode 21. Here, the ohmic contact layer 24 is separated into two parts with respect to the gate electrode 21.

A source electrode 25 and a drain electrode 26 are formed on the ohmic contact layer 24 and the gate insulating layer 22. Further, the source electrode 25 and the drain electrode 26 are separated with respect to the gate electrode 21.

A passivation layer 31 is formed on the source electrode 25, the drain electrode 26, and the semiconductor layer 23 exposed between the source electrode 25 and the drain electrode 26. The passivation layer 31 is also formed on exposed portions of the gate insulating layer 22. The passivation layer 31 may include silicon nitride ($SiN_x$) and/or an organic material. A contact hole 27 is formed in the passivation layer 31 to expose the drain electrode 26.

The pixel electrode 32 is formed on the passivation layer 31. The pixel electrode 32 is referred to as an anode, and supplies a hole to an organic light emitting layer 52. The pixel electrode 32 includes a transparent conductive material such as indium tin oxide ("ITO") or indium zinc oxide ("IZO"), and formed by a sputtering method. The pixel electrode 32 may be patterned as a rectangle, as may be seen in a plan view of the display device 1.

A wall 41 is formed between the pixel electrodes 32. The wall 41 divides the pixel electrodes 32 and defines a pixel region. The wall 41 is formed on the passivation layer 31 in regions corresponding to the TFT 20 and the contact hole 27. The wall 41 prevents the source electrode 25 and the drain electrode 26 of the TFT 20 from being short-circuited with the common electrode 61. The wall 41 may include a photosensitive material such as acrylic resin, or polyimide resin which has heat resistance and solvent resistance, or an inorganic material such as $SiO_2$, and $TiO_2$. Further, the wall 41 may include a double layer having an organic layer and an inorganic layer.

The organic layer 50 includes a hole injecting layer 51 and the organic light emitting layer 52 formed on the pixel electrode 32.

The hole injecting layer 51 may include polythiopene derivative such as poly(3,4-ethylenedioxy thiophene) ("PEDOT") and polystyrene sulfonic acid ("PSS"). The hole injecting layer 51 is formed between the pixel electrode 32 and the organic light emitting layer 52.

The organic light emitting layer 52 includes a red light emitting layer 52a which emits a red light, a green light emitting layer 52b which emits a green light, and a blue light emitting layer 52c which emits a blue light. The red, green, and blue light emitting layers 52a, 52b, and 52c may be alternately formed on adjacent pixels.

The organic light emitting layer 52 may include a poly fluorene derivative, a (poly)paraphenylenevinylene derivative, a polyphenylene derivative, polyvinylcarbazole, and poly thiophene. Further, these polymer materials can be used by being doped with a perylene pigment, a rothermine pigment, rubrene, perylene, 9,10-diphenylanthracene, tetraphenylbutadiene, Nile red, coumarine 6, Quinacridone, etc.

A hole transmitted from the pixel electrode 32 is coupled with an electron from the common electrode 61 on the organic light emitting layer 52 to create an exciton, thereby emitting light during a non-activation process of the exciton.

A common electrode 61 is provided on the wall 41 and the organic light emitting layer 52. The common electrode 61 is called a cathode and supplies an electron to the organic light emitting layer 52. The common electrode 61 may be stacked with a calcium layer and an aluminum layer, although other materials are also within the scope of these embodiments.

Preferably, the calcium layer which has a low work function is disposed adjacent to the organic light emitting layer 52.

Lithium fluoride increases light emitting efficiency according to a material of the organic light emitting layer 52, and thus a lithium fluoride layer may be formed between the organic light emitting layer 52 and the common electrode 61. When the common electrode 61 includes an opaque material such as aluminum Al or silver Ag, light emitted from the organic light emitting layer 52 is transmitted to the insulating substrate 10, in which case the display device 1 is called a bottom emission type. In an alternative embodiment, the display device 1 may instead by a top emission type with the common electrode 61 formed from a conductive transparent material.

The display device 1 may further include an electron transfer layer (not shown) and an electron injection layer (not shown) which are disposed between the organic light emitting layer 52 and the common electrode 61. The display device 1 may further include a passivation film passivating the common electrode 61, and an encapsulation member which prevents moisture and air from being penetrated to the organic layer 50. The encapsulation member may include sealing resin and a sealing can.

Hereinafter, an exemplary method of manufacturing the exemplary display device 1 according to an exemplary embodiment of the present invention will be described with reference to FIGS. 3A to 3M. For purposes of convenience, FIGS. 3B to 3M illustrate only the insulating substrate 10 and the wall 41 of FIG. 3A.

Figure 3A:
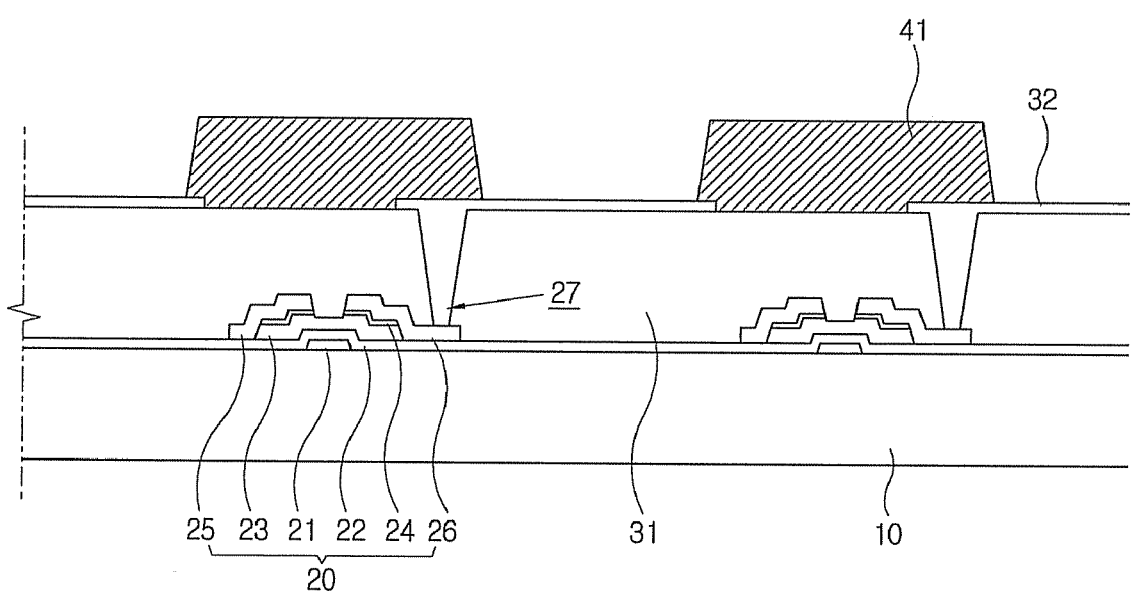

The TFT 20, the pixel electrode 32, and the wall 41 are formed on the insulating substrate 10 as shown in FIG. 3A.

A channel of the TFT 20 includes a-Si, and may be manufactured by well-known methods.

After forming the TFT 20, the passivation layer 31 is formed on the TFT 20 and on exposed portions of the gate insulating layer 22. When the passivation layer 31 includes silicon nitride, the passivation layer 31 may be formed by a chemical vapor deposition ("CVD") method. When the passivation layer 31 includes an organic material, it may be formed by a spin coating or slit coating method. Then, the passivation layer 31 is patterned to form the contact hole 27 for each pixel through which the drain electrode 26 of each TFT 20 is exposed. After forming the contact hole 27, the pixel electrode 32, which is connected with the drain electrode 26 through the contact hole 27, is formed. The pixel electrode 32 may be formed, for example, by depositing indium tin oxide ("ITO") through a sputtering method and then by patterning it.

The wall 41 may be formed by exposure and development processes after coating the pixel electrode 32 with a photosensitive material.

Figure 3B:
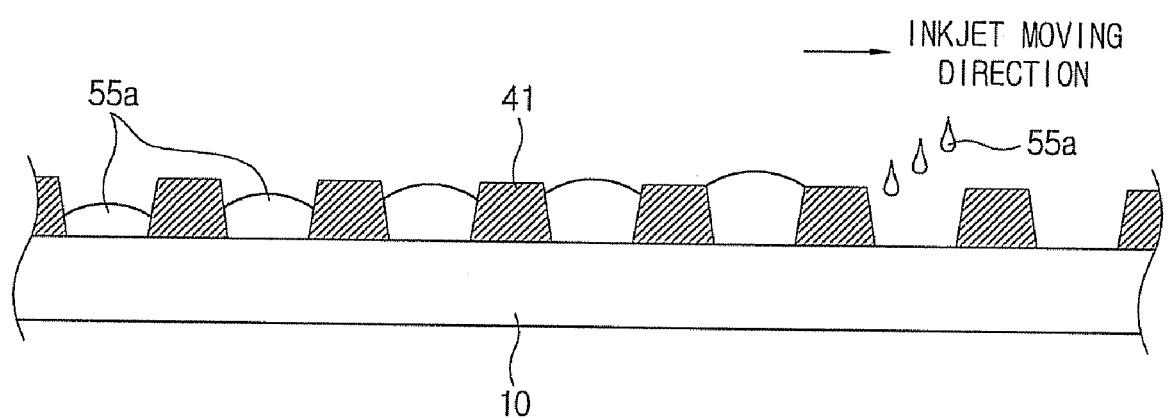

As shown in FIG. 3B, a first hole injecting ink 55a, which includes a hole injecting material as an organic material and a first solvent, is ejected on the pixel electrode 32 through an ink-jet method. The first hole injecting ink 55a is sequentially ejected on the pixel electrodes 32 of the display device 1, such as in an inkjet moving direction. The earlier the first hole injecting ink 55a is ejected on the pixel electrode 32, the more the first solvent of the first hole injecting ink 55a volatilizes.

The first hole injecting ink 55a includes a mixture of polythiopene derivative such as poly 3,4-ethylenedioxythiophene ("PEDOT") and polystylenesulfonic acid ("PSS"), and the first solvent in which the foregoing mixture is dissolved. For example, the first solvent may include isopropyl alcohol ("IPA"), n-butanol, r-butyloloactone, N-methylpyrolidone, 1,3-dimethyl-2-imidazolinone ("DMI") and a derivative thereof, and glycol ether such as carbitol acetate, butylcarbitolacetate, etc.

Figure 3C:
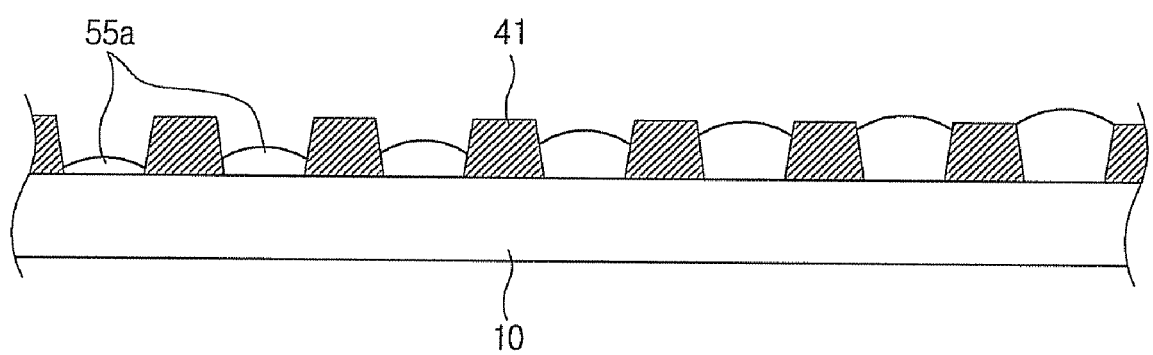

FIG. 3C, with reference to FIG. 3A, illustrates the pixel electrode 32, on which the first hole injecting ink 55a is ejected. The first hole injecting ink 55a on the left side, ejected prior to the first hole injecting ink 55a on the right side, is more dried and the height thereof is lower than the first hole injecting ink 55a on the right side which is ejected after the first hole injecting ink 55a on the left side. It should be understood that the perspective of view may be changed, or the inkjet moving direction may be changed without altering the scope of the invention. That is, the first hole injecting ink 55a ejected on a first side prior to the first hole injecting ink 55a on a second side, is more dried and the height thereof is lower than the first hole injecting ink 55a on the second side which is ejected after the first hole injecting ink 55a on the first side. The dryness of the first hole injecting ink 55a is increased gradually from the second side to the first side and the height of the first hole injecting ink 55a is increased gradually from the first side to the second side. Thus, a first hole injecting ink 55a in a first pixel region ejected prior to a first hole injecting ink 55a in a second pixel region will be more dry and have a lower height than the first hole injecting ink 55a in the second pixel region.

Figure 3D:
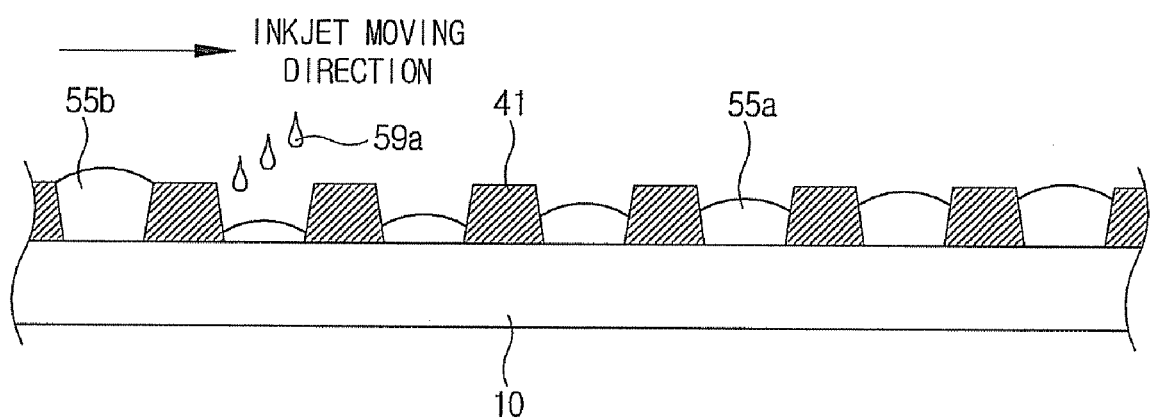
Figure 3E:
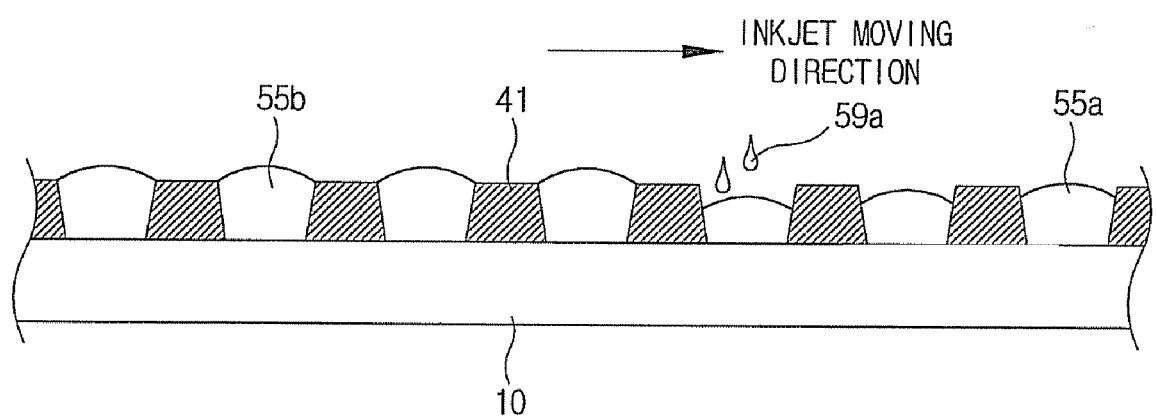

FIGS. 3D and 3E illustrate an exemplary process of supplying a first additional solvent 59a to the first hole injecting ink 55a ejected on the pixel electrode 32. The first additional solvent 59a may be supplied in the inkjet moving direction as indicated. A second hole injecting ink 55b is thus formed by supplying the first additional solvent 59a to the first hole injecting ink 55a.

The first additional solvent 59a is ejected on the first hole injecting ink 55a on the pixel electrode 32 through an ink-jet method. The ejected amount of the first additional solvent 59a varies depending on the dryness of the first hole injecting ink 55a. The first hole injecting ink 55a on the left side of the display device 1, or the first side of the display device 1 that first receives the first hole injecting ink 55a, which is more dried receives a relatively larger amount of the first additional solvent 59a than that on the right side of the display device 1, or the second side of the display device 1 that later receives the first hole injecting ink 55a, which is less dried. In one exemplary embodiment, the first additional solvent 59a may not be ejected on the later-ejected first hole injecting ink 55a.

The first additional solvent 59a may vary as follows.

First, the first additional solvent 59a may have the same material as the first solvent of the first hole injecting ink 55a.

Second, the first additional solvent 59a may include a material which has a higher boiling point than the first hole injecting ink 55a, to restrain the volatility of the second hole injecting ink 55b. Here, the first additional solvent 59a may dissolve the hole injecting material of the first hole injecting ink 55a.

Third, when the first solvent of the first hole injecting ink 55a includes a first sub solvent having a low boiling point and a second sub solvent having a high boiling point, the first additional solvent 59a may include the same material as the second sub solvent, to restrain the volatility of the second hole injecting ink 55b. Preferably, the boiling point difference between the first and second sub solvents is 50° C. or more. More specifically, the boiling point difference therebetween may be between about 50° C. to about 100° C.

The first additional solvent 59a may be ejected faster than the first hole injecting ink 55a since the quality of the hole injecting layer 51 is not much affected even if the first additional solvent 59a is ejected on the wall 41.

Figure 3F:
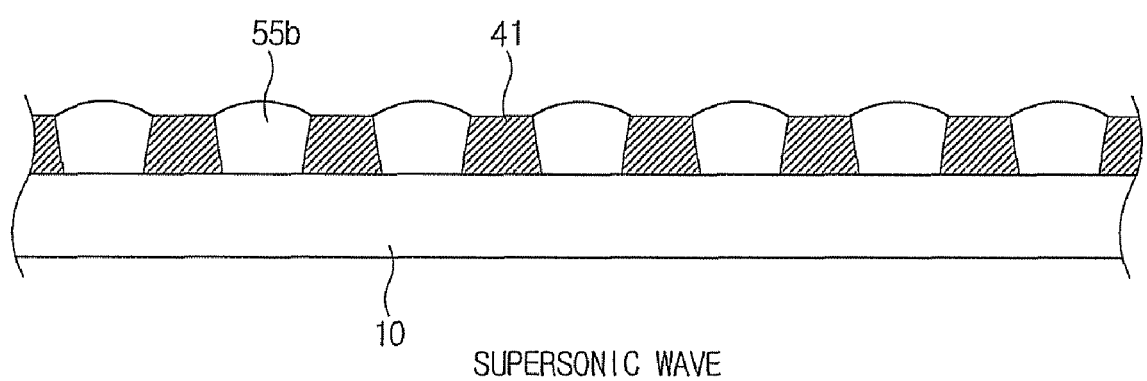

FIG. 3F illustrates an exemplary process of applying supersonic waves to the second hole injecting ink 55b ejected on the pixel electrodes 32. The second hole injecting ink 55b is ejected on the pixel electrodes 32 with the same height, or at least substantially the same height. The combined amount of the first solvent of the first hole injecting ink 55a and the first additional solvent 59a is substantially uniform across the pixel electrodes 32 of the display device 1.

The hole injecting material of the second hole injecting ink 55b is redissolved by the first solvent of the first hole injecting ink 55a and the first additional solvent 59a. The supersonic waves vibrate the second hole injecting ink 55b to facilitate redissolution of the hole injecting material. Alternatively, the supersonic waves may be applied at the same time with the ejecting of the first additional solvent 59a. The supersonic waves may be applied by connecting the insulating substrate 10 to a supersonic wave generator (not shown).

Figure 3G:
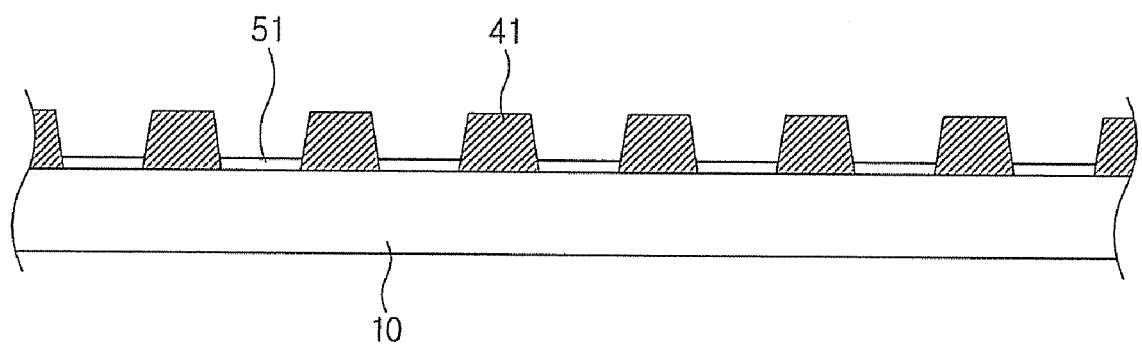

FIG. 3G illustrates the hole injecting layer 51 which is formed by drying the second hole injecting ink 55b, which is ejected using the exemplary method as illustrated in FIGS. 3B to 3F. The second hole injecting ink 55b is dried while it is uniformly formed across the pixel electrodes 32 due to the first additional solvent 59a. The hole injecting layer 51 formed through the drying of the second hole injecting ink 55b has a uniform quality in all areas thereof.

The hole injecting layer 51 has a uniform thickness on the pixel electrode 32 since the hole injecting material of the second hole injecting ink 55b is dried while it is uniformly dissolved by the solvent due to the first additional solvent 59a and supersonic waves. Since a coffee-ring effect, which would generate a thicker circumference, is restricted, the hole injecting layer 51 has a uniform thickness. This can be applicable to the organic light emitting layer 52, as will be further described below.

In forming the hole injecting layer 51, the second hole injecting ink 55b may be dried by lowering the pressure to about 1 Torr at room temperature under nitrogen atmosphere. When the pressure is too low, the second hole injecting ink 55b may be drastically boiled. When the temperature is higher than room temperature, the vaporizing speed of the solvent rises, thereby possibly failing to form the layer in a uniform thickness.

When the second hole injecting ink 55b is completely dried, it may be heated at about 200° C. for around 10 minutes, preferably in a vacuum. Here, any, or substantially any, solvent or water remaining in the hole injecting layer 51 is removed.

Figure 3H:
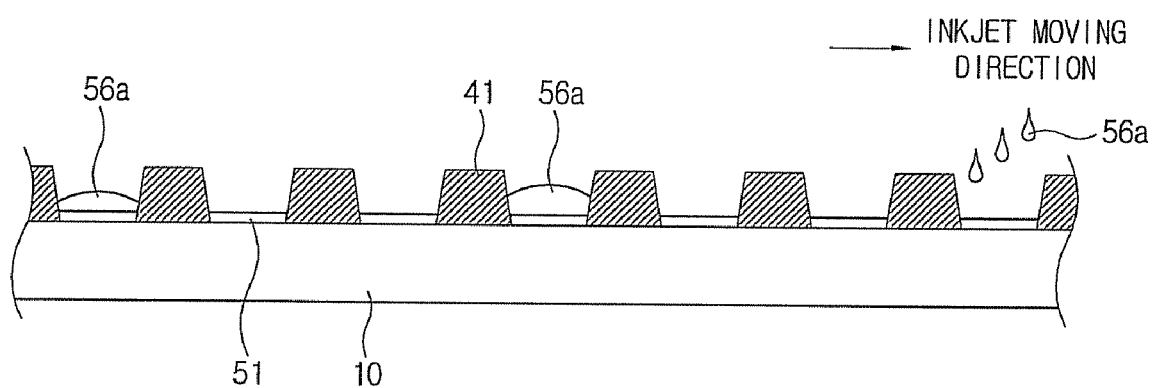
Figure 31:
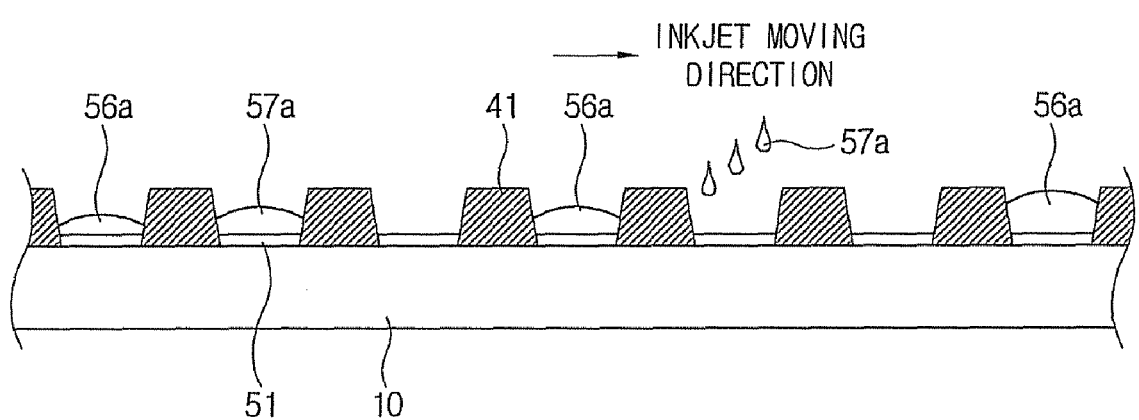
Figure 3J:
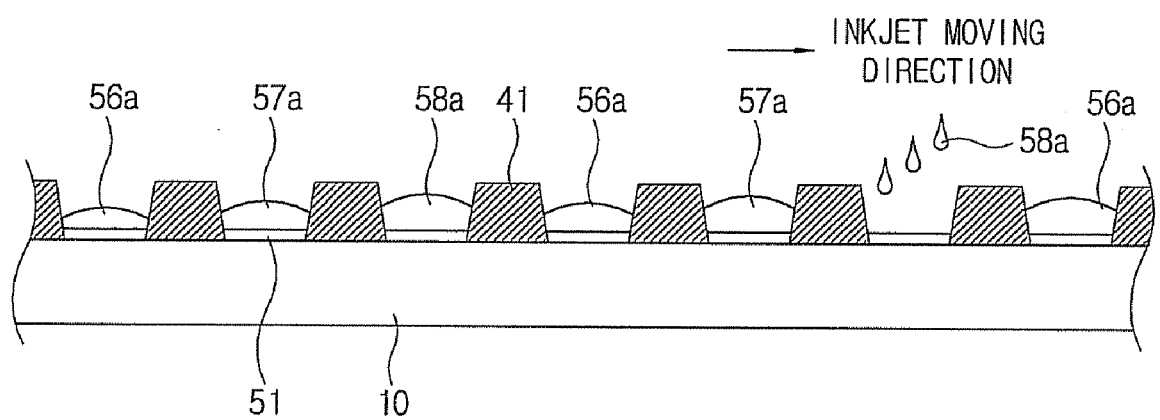

FIGS. 3H to 3J illustrate an exemplary process of ejecting a first red light emitting ink 56a, a first green light emitting ink 57a, and a first blue light emitting ink 58a on the pixel electrode 32 having the hole injecting layer 51 formed thereon, to form the organic light emitting layer 52.

The first light emitting inks 56a, 57a, and 58a include a red light emitting material, a green light emitting material, and a blue light emitting material, which are organic materials, respectively, and have a second solvent in common. The second solvent may include a nonpolar solvent, e.g., cyclohexylbenzene, dehydrobenzofuran, trimethylbenzene, tetramethylbenzene, to which the hole injecting layer 51 is insoluble, thereby preventing redissolution of the hole injecting layer 51.

The first light emitting inks 56a, 57a, and 58a are sequentially ejected per color. For example, first the first red light emitting ink 56a is ejected on every third pixel ("P") region, e.g. P1, P4, P7, etc. After ejecting the first red light emitting ink 56a, the first green light emitting ink 57a is ejected on every third pixel region, e.g. P2, P5, P8, etc. After ejecting the first green light emitting ink 57a, the first blue light emitting ink 58a is ejected on every third pixel region, e.g. P3, P6, P9, etc., which is also every remaining pixel region. The first light emitting inks 56a, 57a, and 58a may all be ejected in the same inkjet moving direction. While a particular order of ejecting has been described, alternative orders of color ejecting would also be within the scope of these embodiments.

Figure 3K:
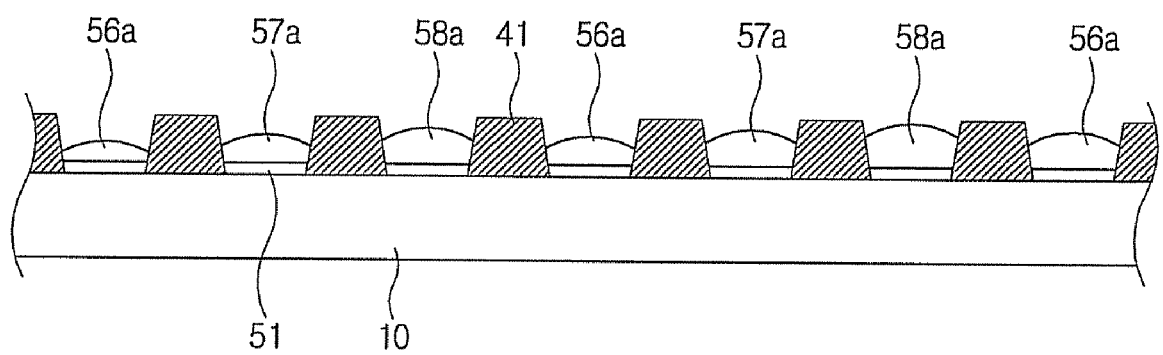

FIG. 3K illustrates the substrate 10 on which the first light emitting inks 56a, 57a, and 58a are completely ejected. The first light emitting inks 56a, 57a, and 58a are ejected sequentially, thereby taking a long ejecting time and representing a greater difference of dryness than with the first hole injecting ink 55a.

Figure 3L:
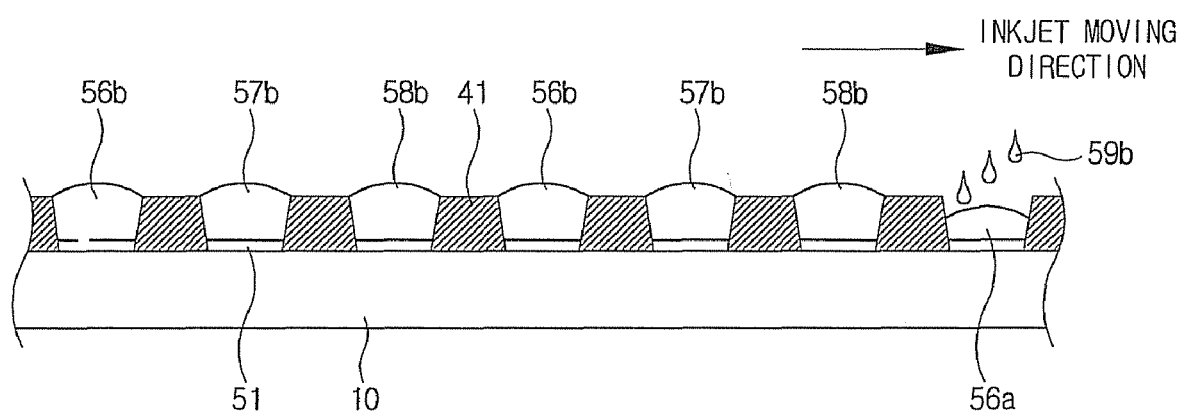

FIG. 3L illustrates an exemplary process of supplying a second additional solvent 59b to the first light emitting inks 56a, 57a, and 58a. The second additional solvent 59b has the same material as the second solvent of the first light emitting inks 56a, 57a, and 58a. The second additional solvent 59b is supplied in varying amounts depending on the dryness of the first light emitting inks 56a, 57a, and 58a. The second additional solvent 59b may be supplied to the first light emitting inks 56a, 57a, and 58a in the inkjet moving direction as indicated. Second light emitting inks 56b, 57b, and 58b are ejected by supplying the second additional solvent 59b to the first light emitting inks 56a, 57a, and 58a.

Figure 3M:
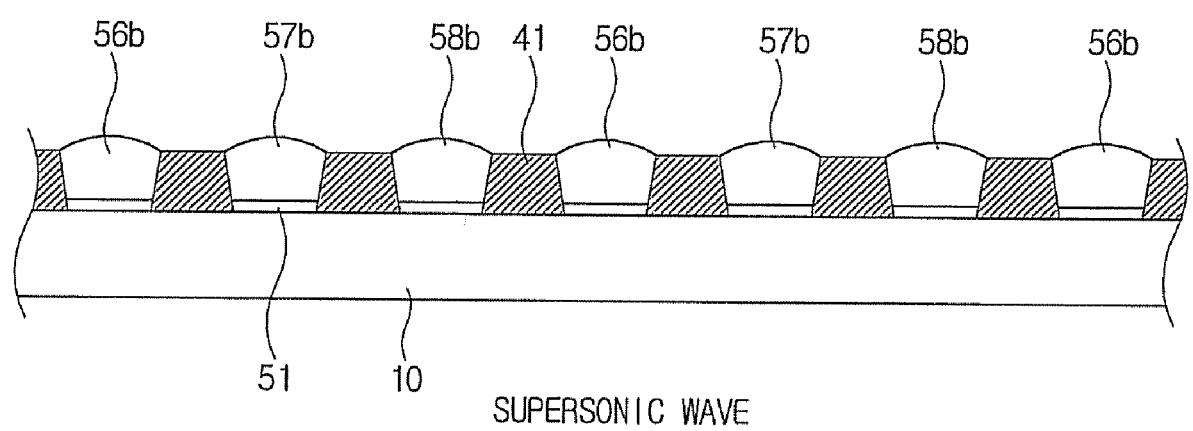

FIG. 3M illustrates an exemplary process of applying supersonic waves to the second light emitting inks 56b, 57b, and 58b after the second additional solvent 59b is completely ejected.

The organic material of the second light emitting inks 56b, 57b, and 58b may be redissolved by a third solvent and the second additional solvent 59b. The supersonic waves facilitate the dissolution of the second light emitting inks 56b, 57b and 58b by vibrating them. Although the supersonic waves are illustrated and described as applied after the ejecting of the second light emitting inks 56b, 57b, and 58b, alternatively, the supersonic waves may be applied at the same time with the ejecting of the second additional solvent 59b on the first light emitting inks 56a, 57a, and 58a.

The same method of drying the second hole injecting ink 55b may be used to dry the second light emitting inks 56b, 57b, and 58b. The second light emitting inks 56b, 57b, and 58b are dried to form the organic light emitting layer 52, as shown for example in FIG. 2. The second light emitting inks 56b, 57b, and 58b are uniformly formed across the pixel electrodes 32 due to the second additional solvent 59b, thereby uniformly forming the organic light emitting layer 52.

The common electrode 61 is formed on the wall 41 and the organic light emitting layer 52 to complete the display device 1 as shown in FIG. 2.

Alternatively, the first additional solvent 59a may not be used while forming the hole injecting layer 51, since the organic light emitting layer 52 is less likely to be formed uniformly than the hole injecting layer 51.

Figure 4A:
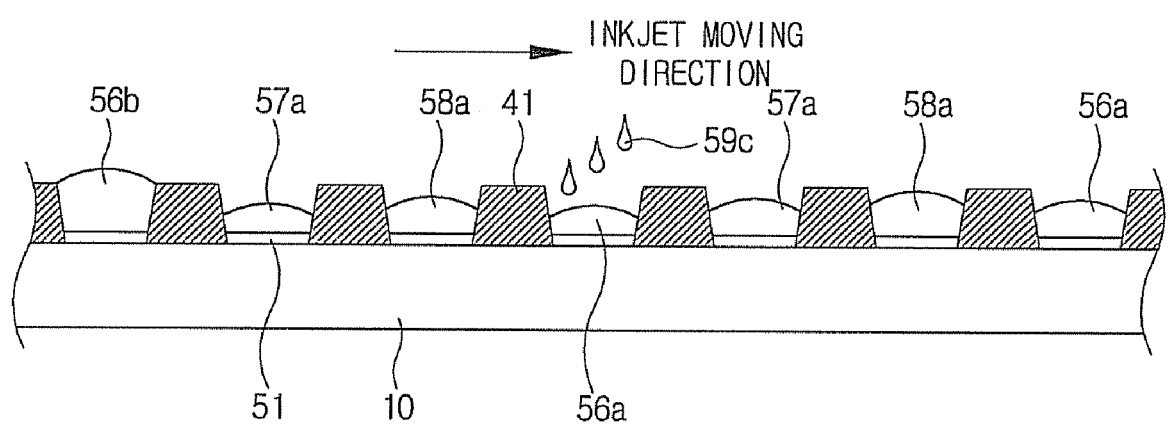
FIGS. 4A to 4C illustrate another exemplary manufacturing method of the exemplary display device according to the exemplary embodiment of the present invention.
Figure 4B:
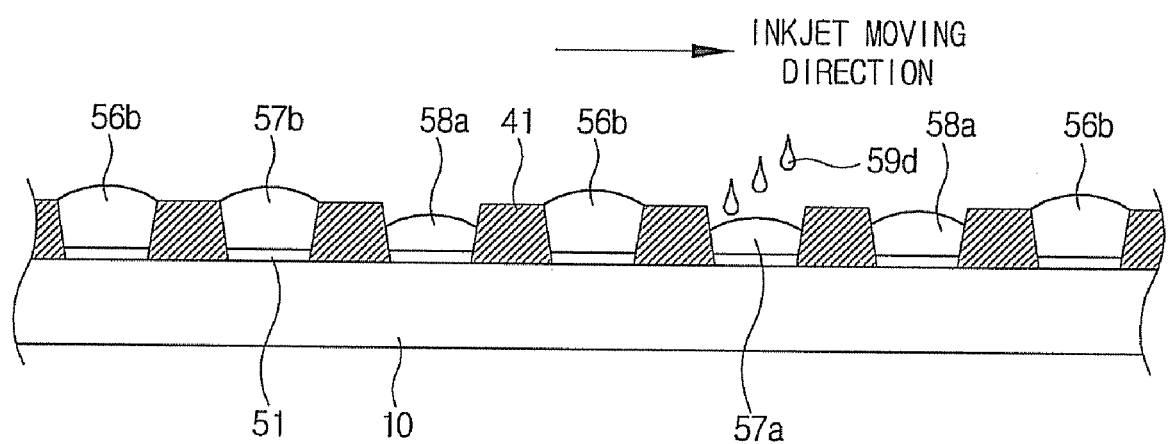
Figure 4C:
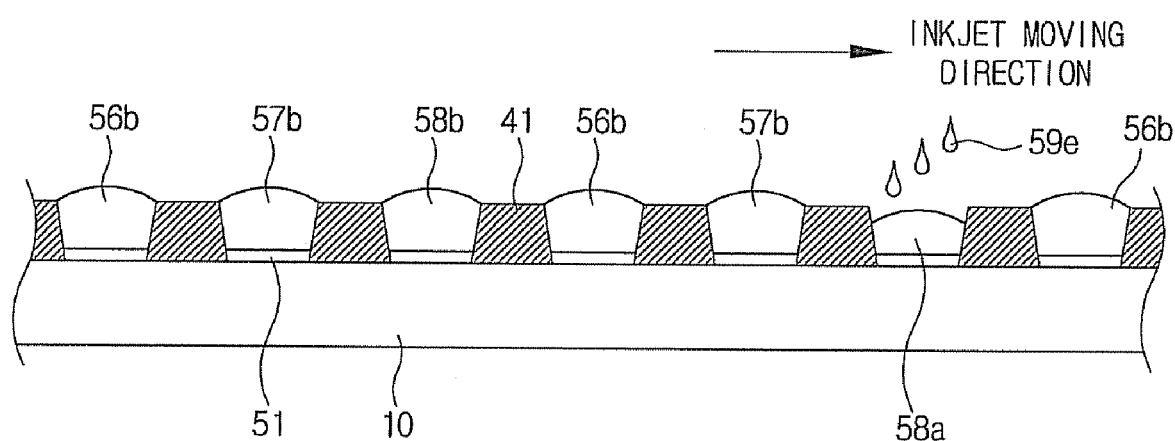

FIGS. 4A to 4C illustrate another exemplary manufacturing method of the exemplary display device 1 according to an exemplary embodiment of the present invention.

FIG. 4A illustrates an exemplary process of ejecting a third additional solvent 59c to the first red light emitting ink 56a after ejecting the first light emitting inks 56a/57a, and 58a. Unlike the exemplary method described with respect to FIGS. 3H to 3M of forming the organic light emitting layer 52, here, the second solvent of the first light emitting inks 56a, 57a, and 58a have different materials from each other. The third additional solvent 59c is ejected on the first red light emitting ink 56a alone. The second red light emitting ink 56b is formed by supplying the third additional solvent 59c to the first red light emitting ink 56a.

FIG. 4B illustrates a process of ejecting a fourth additional solvent 59d to the first green light emitting ink 57a. The second green light emitting ink 57b is formed by mixing the first green light emitting ink 57a and the fourth additional solvent 59d.

FIG. 4C illustrates a process of ejecting a fifth additional solvent 59e on the first blue light emitting ink 58a. The second blue light emitting ink 58b is formed by adding the fifth additional solvent 59e to the first blue light emitting ink 58a.

The ejected amounts of the additional solvents 59c, 59d, and 59e are adjusted in consideration with the dryness of each of the first light emitting inks 56a, 57a and 58a, thereby maintaining the second light emitting inks 56b, 57b and 58b in a uniform amount.

After ejecting the second light emitting inks 56b, 57b and 58b, the organic light emitting layer 52 is formed by applying supersonic waves and drying it.

As the second light emitting inks 56b, 57b, and 58b are uniformly ejected across the pixel electrodes 32 due to the additional solvents 59c, 59d, and 59e, the organic light emitting layer 52 therefrom has the uniform quality.

The foregoing ink-jet methods that use the additional solvents may be applicable to manufacturing substrates for other display devices, other than an organic light emitting diode ("OLED").

For example, the ink-jet method of the present invention may be applicable to manufacturing an organic TFT substrate that uses an organic semiconductor as a semiconductor layer. The additional solvent may make the quality of the semiconductor layer and the TFT uniform.

The organic TFT substrate may be used in the above described OLED or in a liquid crystal display ("LCD") device.

The ink-jet method according to exemplary embodiments of the present invention may be used in manufacturing a color filter substrate. After ejecting color filter ink between black matrices having a grid shape, an additional solvent is supplied to make the quality of the color filter uniform.

The color filter substrate may be used in the LCD device.

As described above, the present invention provides an exemplary manufacturing method of an exemplary display device having a uniform organic layer, and the exemplary display device formed using the exemplary manufacturing method.

Although exemplary embodiments of the present invention have been shown and described, it will be appreciated by those skilled in the art that changes may be made in these embodiments without departing from the principles and spirit of the invention, the scope of which is defined in the appended claims and their equivalents.

What is claimed is:

1. A method of manufacturing a display device, the method comprising:
   forming a plurality of areas on an insulating substrate of the display device;
   sequentially ejecting ink including an organic material and a first solvent within each area; and,
   supplying a second solvent to the ink to form an organic layer having substantially uniform quality across the display device,
   wherein supplying the second solvent includes supplying more of the second solvent to an earlier-ejected portion of the ink than to a later-ejected portion of the ink;
   wherein supplying the second solvent includes supplying the second solvent after ejecting the ink on all the plurality of areas.

2. The method of claim 1, wherein forming the plurality of areas includes forming a black matrix on an insulating substrate of a color filter substrate, and sequentially ejecting ink includes alternately ejecting red, green, and blue color filter inks within the areas.

3. The method according to claim 1, wherein forming the plurality of areas includes forming walled areas of an organic light emitting diode display and the ink is a hole injecting ink, and further comprising forming a hole injecting layer from the hole injecting ink and the second solvent.

4. The method according to claim 3, further comprising alternately ejecting red, green, and blue light emitting inks, each including a third solvent, on the hole injecting layer and supplying a fourth solvent to the red, green, and blue light, emitting inks to form an organic light emitting layer.

5. The method according to claim 1, wherein the display device includes an organic thin film transistor substrate having a plurality of organic thin film transistors, and the organic material of the ink includes an organic semiconductor material, the method further comprising forming a semiconductor layer of each organic thin film transistor from the ink and the second solvent.

6. A method of manufacturing a display device, the method comprising:
   forming a plurality of thin film transistors on an insulating substrate;
   forming a plurality of electrodes electrically connected to the thin film transistors;
   forming a wall surrounding the electrodes;
   sequentially ejecting ink including an organic material and a first solvent on the electrodes surrounded by the wall; and
   supplying a second solvent to the ink ejected on the electrodes,
   wherein supplying the second solvent includes supplying more of the second solvent to an earlier-ejected portion of the ink than to a later-ejected portion of the ink;
   wherein supplying the second solvent includes supplying the second solvent after ejecting the ink on all the plurality of electrodes.

7. The method according to claim 1, wherein more of the first solvent volatilizes the earlier the ink is ejected, and wherein a combined amount of the first solvent remaining on the plurality of electrodes and the second solvent is substantially uniform across the plurality of electrodes.

8. The method according to claim 1, further comprising: applying a supersonic wave to the ink which has received the second solvent.

9. The method according to claim 1, wherein the first and second solvents comprise a same material.

10. The method according to claim 1, wherein the first solvent comprises a first sub solvent having a first boiling point and a second sub solvent having a second boiling point that is higher than the first boiling point, and the second solvent and the second sub solvent comprise a same material.

11. The method according to claim 1, wherein the first solvent has a lower boiling point than the second solvent.

12. The method according to claim 1, wherein the organic material of the ink is dissolved by the first solvent of the ink and the second solvent after supplying the second solvent.

13. The method according to claim 12, further comprising: forming an organic layer by drying and removing the first solvent and the second solvent while the organic material is dissolved.

14. The method according to claim 13, wherein the organic layer comprises an organic light emitting layer.

15. The method according to claim 1, wherein the ink and the second solvent are ejected through an ink-jet method, and the second solvent is ejected less accurately than the ink.

16. The method according to claim 1, wherein the ink is a hole injecting ink, the method further comprising forming a hole injecting layer with the hole injecting ink and the second solvent.

17. The method according to claim 16, further comprising ejecting a colored light emitting ink on the hole injecting layer, the colored light emitting ink including a light emitting material and a third solvent, and supplying a fourth solvent to the colored light emitting ink ejected on the hole injecting layer.

18. The method according to claim 17, further comprising forming an organic light emitting layer with the colored light emitting ink and the fourth solvent.

19. The method according to claim 1, wherein ejecting ink includes alternately ejecting red, green, and blue light emitting inks, and further forming an organic light emitting layer of uniform thickness from the red, green, and blue light emitting inks and the second solvent.

20. The method according to claim 19, wherein the second solvent is different for each of the red, green, and blue light emitting inks.

* * * * *